United States Patent
Chen et al.

(10) Patent No.: US 9,231,034 B1
(45) Date of Patent: Jan. 5, 2016

(54) ORGANIC LIGHT-EMITTING DIODE DISPLAYS

(71) Applicant: Apple Inc., Cupertino, CA (US)

(72) Inventors: Chieh-Wei Chen, Cupertino, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/466,111

(22) Filed: Aug. 22, 2014

Related U.S. Application Data

(60) Provisional application No. 61/924,634, filed on Jan. 7, 2014.

(51) Int. Cl.
*H01L 51/50* (2006.01)
*H01L 51/52* (2006.01)
*H01L 27/32* (2006.01)

(52) U.S. Cl.
CPC .......... *H01L 27/3218* (2013.01); *H01L 27/322* (2013.01); *H01L 27/3209* (2013.01); *H01L 27/3213* (2013.01)

(58) Field of Classification Search
CPC .............. H01L 27/3218; H01L 27/322; H01L 27/3213; H01L 27/3209
USPC ................................. 313/498–512
See application file for complete search history.

(56) References Cited

U.S. PATENT DOCUMENTS

| | | | |
|---|---|---|---|
| 7,498,603 B2 | 3/2009 | Rogojevic et al. | |
| 7,808,451 B1 | 10/2010 | Rutherford | |
| 7,956,531 B2 | 6/2011 | Smith | |
| 8,183,766 B2 | 5/2012 | Chao et al. | |
| 8,339,386 B2 | 12/2012 | Leon et al. | |
| 8,497,821 B2 | 7/2013 | Cok | |
| 2007/0102737 A1* | 5/2007 | Kashiwabara et al. | 257/291 |
| 2008/0278066 A1* | 11/2008 | Spindler | H01L 51/5278 313/504 |
| 2010/0117517 A1* | 5/2010 | Cok et al. | 313/503 |
| 2010/0156280 A1* | 6/2010 | Song et al. | 313/504 |
| 2012/0176025 A1* | 7/2012 | Lee et al. | 313/503 |
| 2014/0183471 A1* | 7/2014 | Heo | 257/40 |

* cited by examiner

*Primary Examiner* — Anne Hines
*Assistant Examiner* — Jose M Diaz
(74) *Attorney, Agent, or Firm* — Treyz Law Group, P.C.; G. Victor Treyz; Joseph F. Guihan

(57) ABSTRACT

An electronic device may include a display having an array of organic light-emitting diode display pixels. Color filter elements may be used to allow the display to present color images. A blue subpixel may be formed using part of an emissive layer and red and green subpixels may share a separate second part of the emissive layer. In four-subpixel designs, a white or yellow subpixel may also share the emissive layer with the red and green subpixels. Tandem diode configurations may be used in which a blue subpixel has two blue diodes connected in series and other subpixels are formed from respective pairs of series-connected diodes. A pixel definition layer may be formed from a light-absorbing material to suppress ambient light reflections.

21 Claims, 17 Drawing Sheets

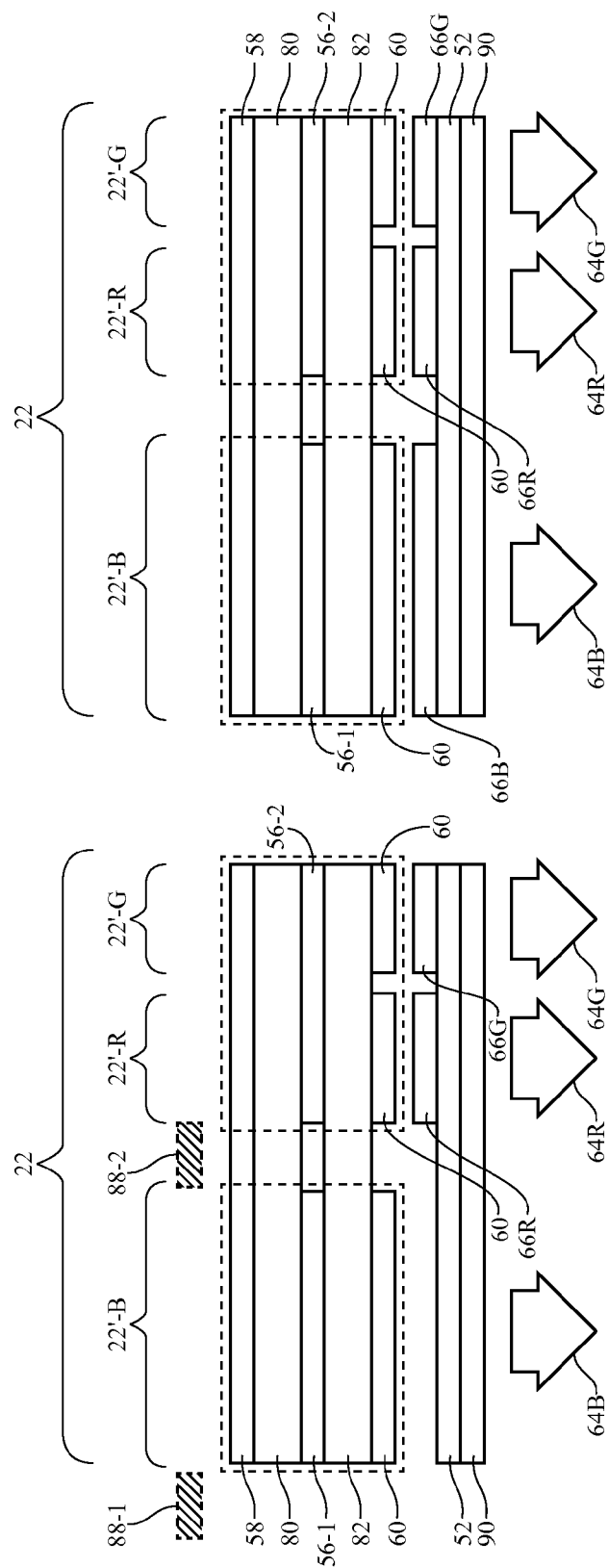

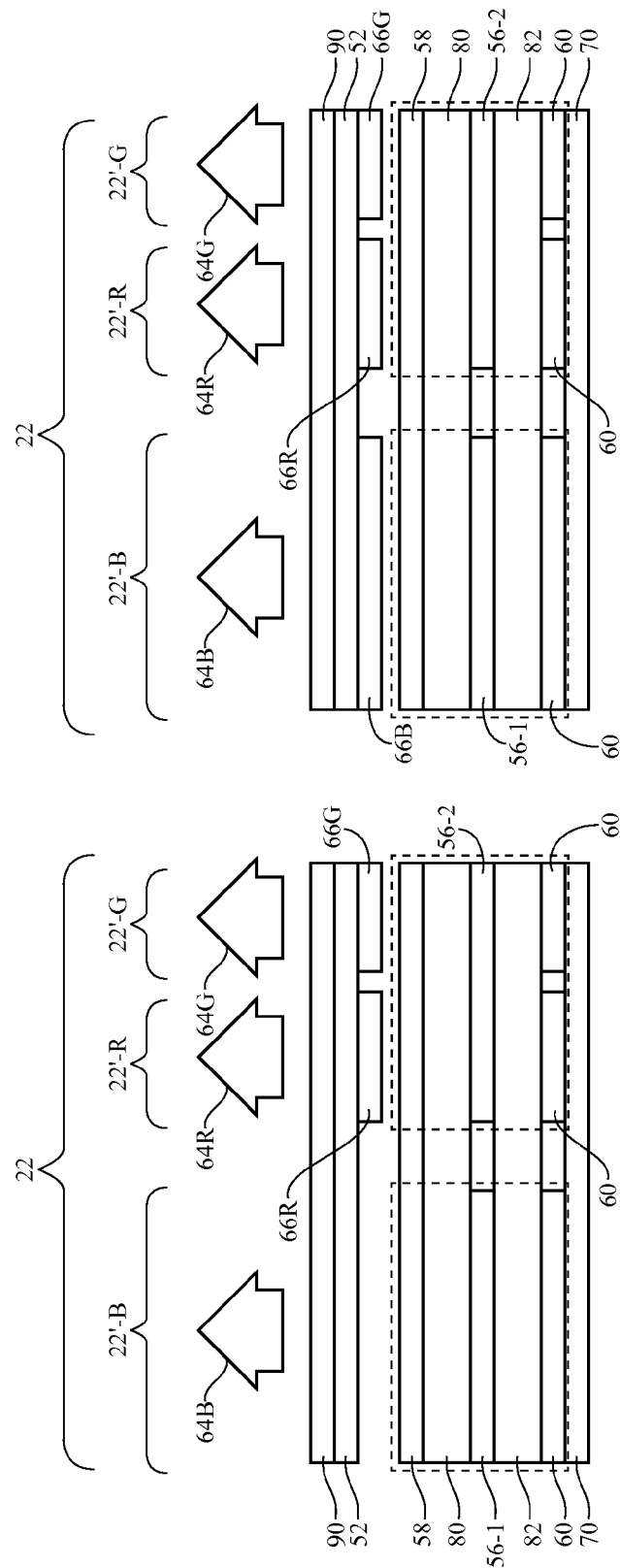

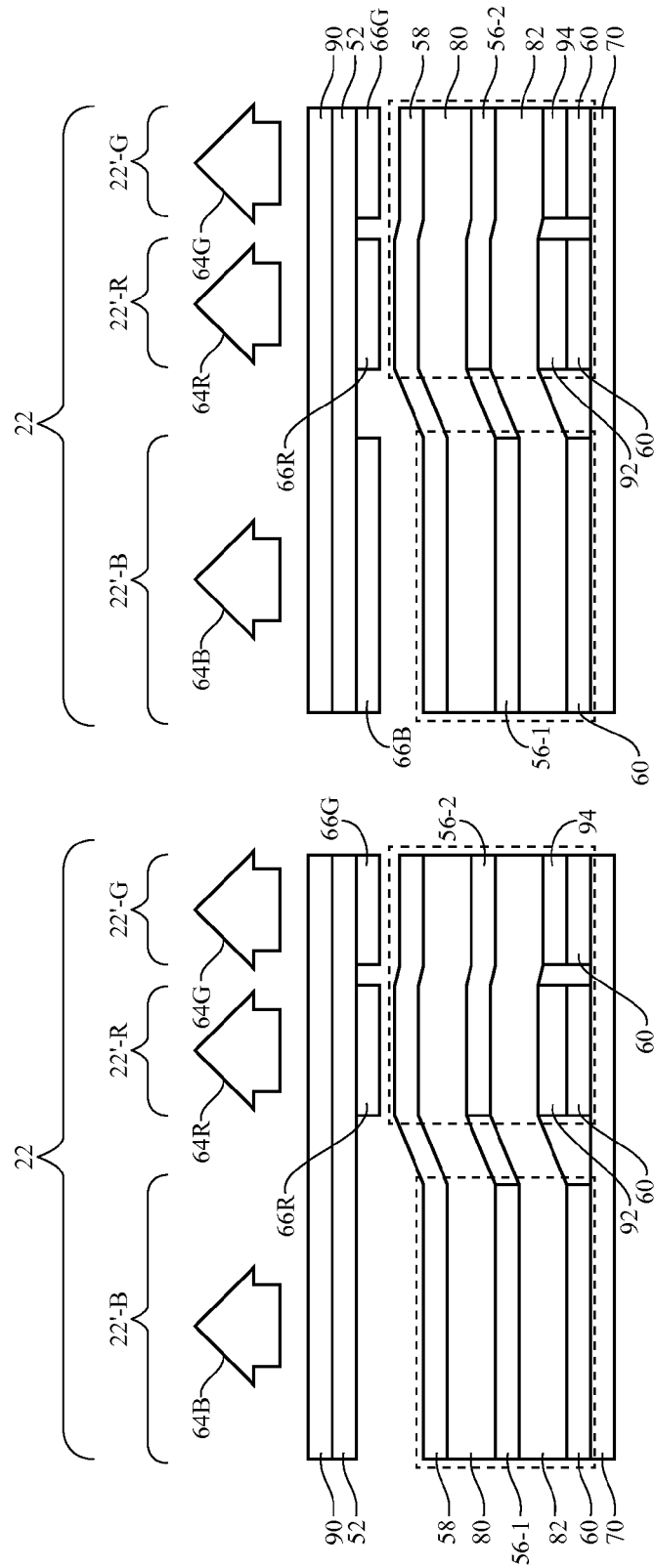

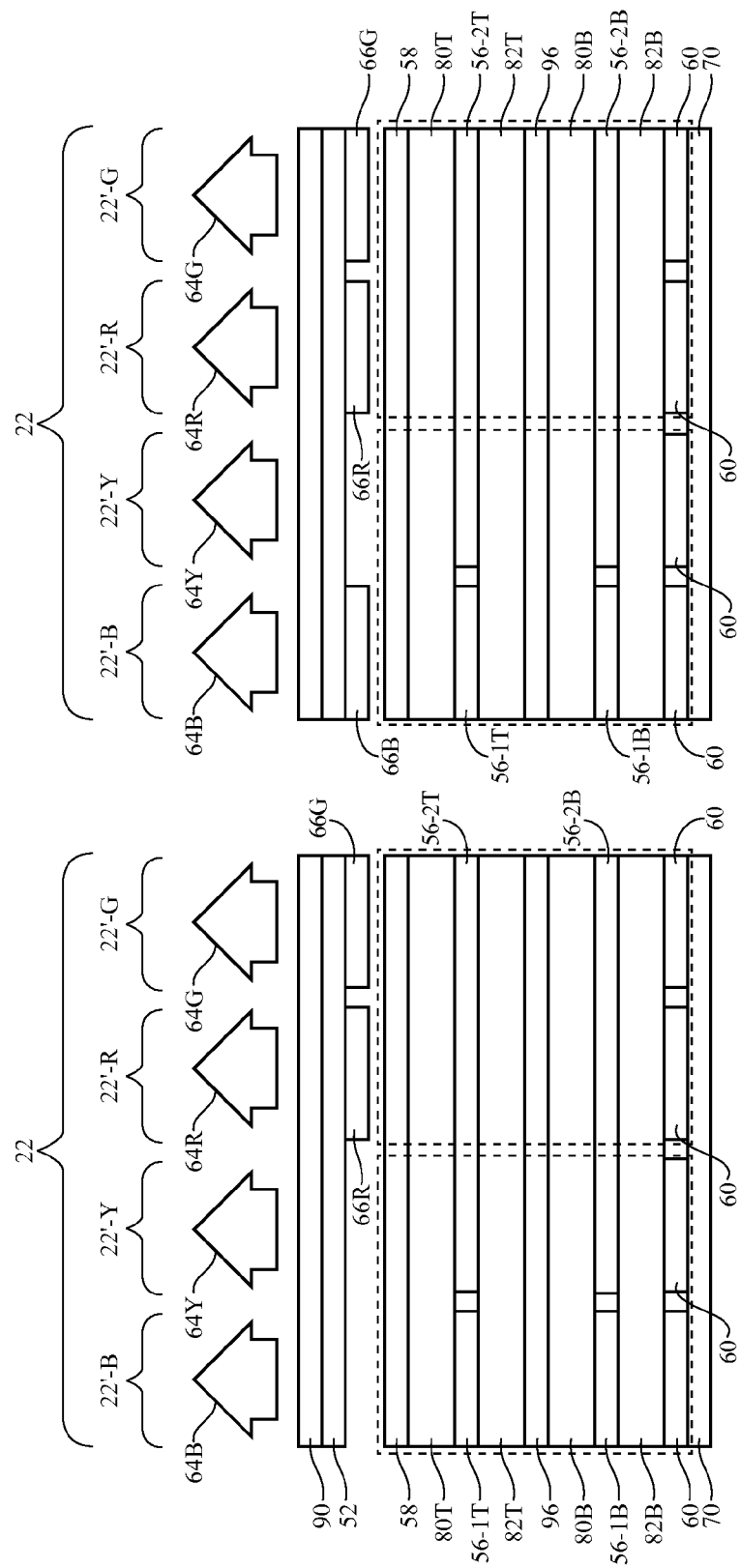

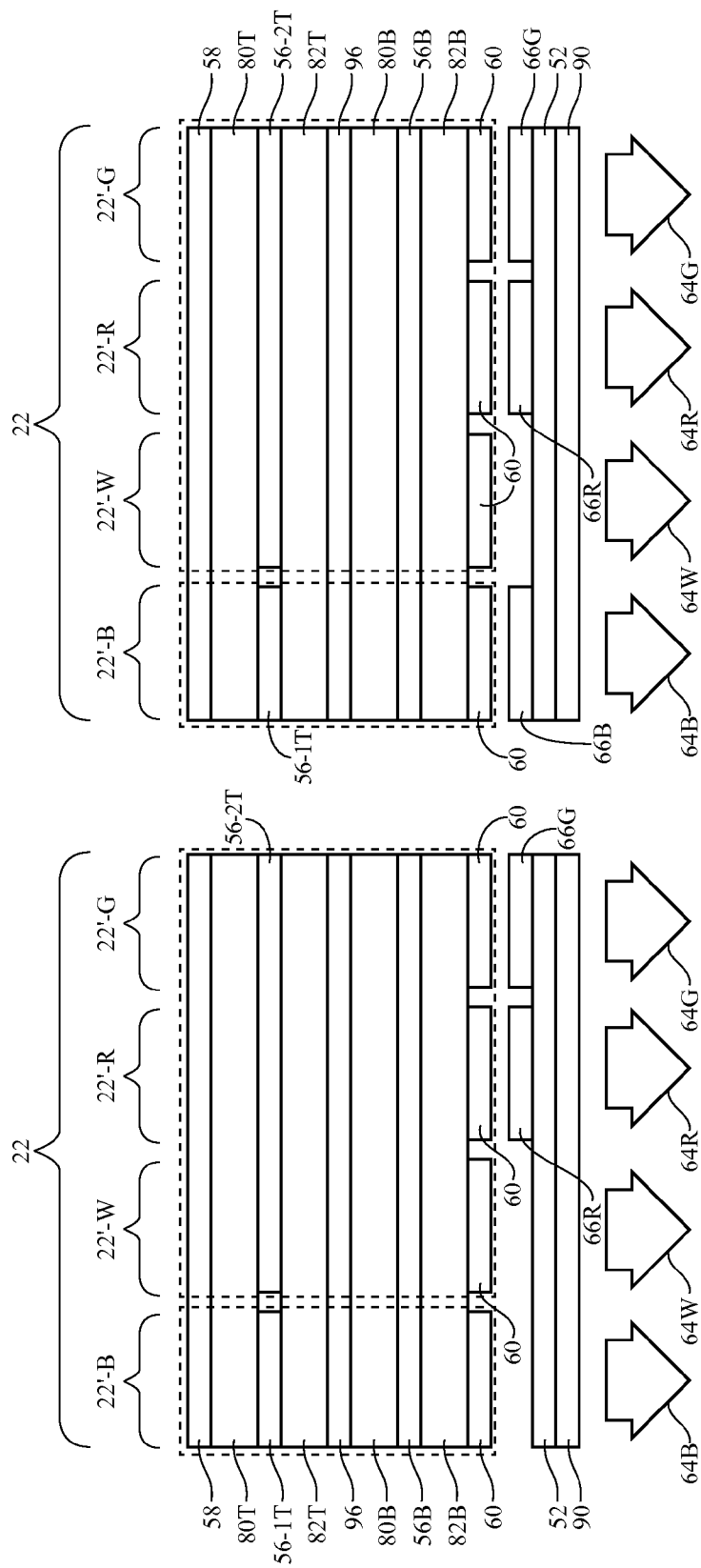

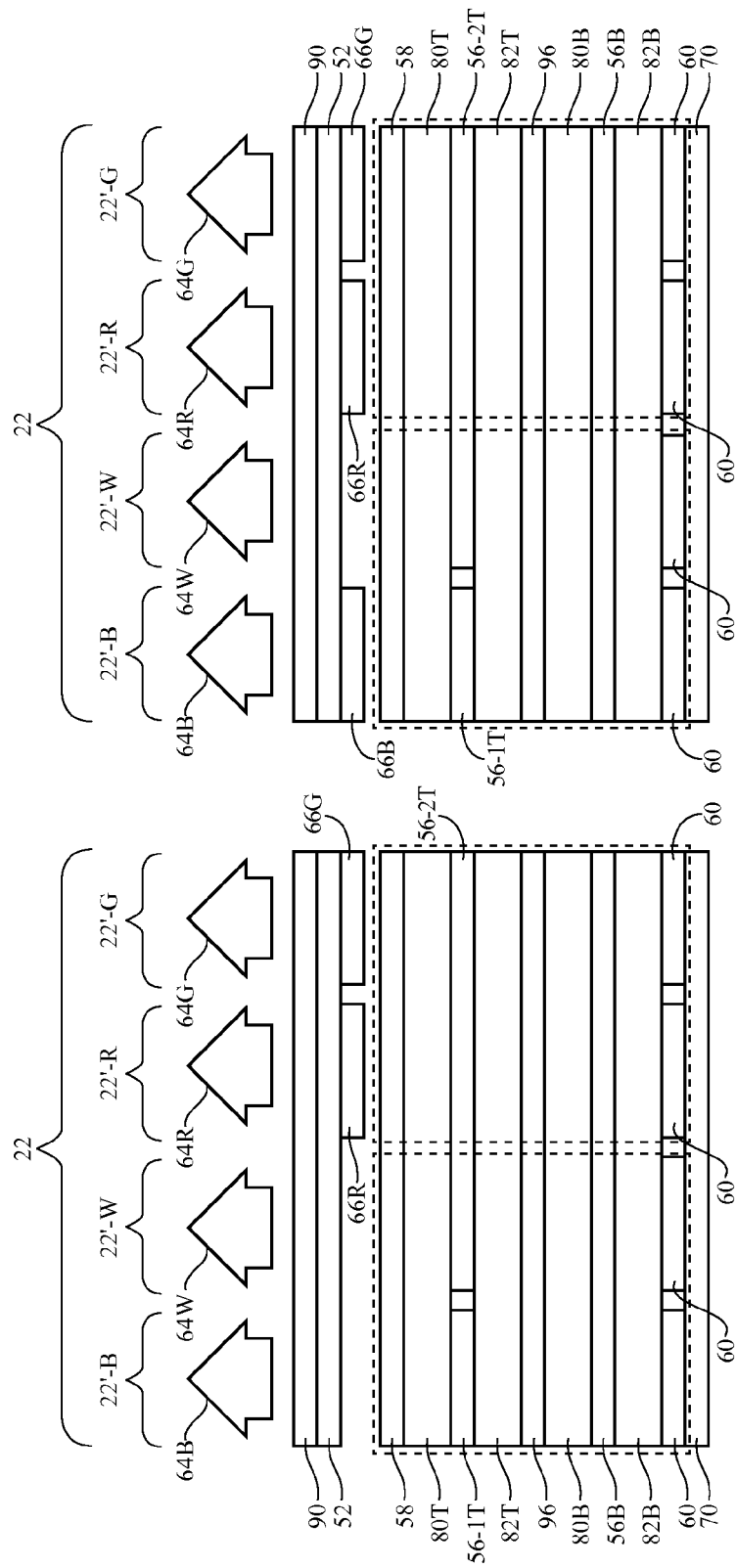

ORGANIC LIGHT-EMITTING DIODE DISPLAYS

This application claims the benefit of provisional patent application No. 61/924,634, filed Jan. 7, 2014, which is hereby incorporated by reference herein in its entirety.

BACKGROUND

This relates generally to electronic devices and, more particularly, to electronic devices with organic light-emitting diode displays.

Electronic devices often include displays. For example, an electronic device may have an organic light-emitting diode display with an array of display pixels. The display pixels may each have subpixels. Color filter elements of different colors may be included in the subpixels to provide the subpixels with the ability to emit light of different colors. As an example, each pixel in a display may have a red subpixel, a green subpixel, and a blue subpixel.

There are challenges associated with optimizing display performance in an organic light-emitting diode display. If care is not taken, pixel pitch will be low, pixel apertures will be small, and light emitting efficiency will be poor.

It would therefore be desirable to be able to provide improved displays such as improved organic light-emitting diode displays.

SUMMARY

An electronic device may include a display having an array of organic light-emitting diode display pixels. Color filter elements may be used to allow the display to present color images to a viewer. A blue subpixel may be formed using a first part of an emissive layer and red and green subpixels may share a second part of the emissive layer. In four-subpixel designs, a white or yellow subpixel may share the second part of the emissive layer with the red and green subpixels. Tandem diode configurations may be used in which a blue subpixel has two blue diodes connected in series each with a respective blue emissive organic layer. Additional (non-blue) subpixels in a display pixel may also be implemented in a tandem configuration so that each of these subpixels has a respective pair of series-connected diodes.

A pixel definition layer may be formed form a light-absorbing material to suppress ambient light reflections. The pixel definition layer may be coated with a moisture barrier to prevent outgassing of water vapor from the pixel definition layer.

A display pixel may be provided with optical cavity structures. Cavity modification layers formed of transparent material of different thicknesses may be used to tune the wavelength resonances of cavities for subpixels of different colors. For example, an optical cavity for a red subpixel may be tuned to resonate at red wavelengths by making cavity length adjustments and other optical cavity adjustments. If desired, a hole injection layer may be deposited with locally varying thicknesses using inkjet printing or other localized deposition techniques. The varying thicknesses of the hole injection layer may be used to tune that optical cavities of the subpixels of different colors.2

BRIEF DESCRIPTION OF THE DRAWINGS

FIG. 5 is a cross-sectional side view of an illustrative bottom-emission organic light-emitting diode display pixel with a two-stripe design having red and green color filters and having a blue subpixel without a blue color filter in accordance with an embodiment.

FIG. 6 is a cross-sectional side view of an illustrative bottom-emission organic light-emitting diode display pixel with a two-stripe design having red and green color filters and having a blue subpixel with a blue color filter in accordance with an embodiment.

FIG. 7 is a cross-sectional side view of an illustrative top-emission organic light-emitting diode display pixel having a weak cavity and having a two-stripe design with red and green color filters and with a blue subpixel without a blue color filter in accordance with an embodiment.

FIG. 8 is a cross-sectional side view of an illustrative top-emission organic light-emitting diode display pixel having a weak cavity and having a two-stripe design with red and green color filters and with a blue subpixel with a blue color filter in accordance with an embodiment.

FIG. 9 is a cross-sectional side view of an illustrative top-emission organic light-emitting diode display pixel having a strong cavity and having a two-stripe design with red and green color filters and a blue subpixel without a blue color filter in accordance with an embodiment.

FIG. 10 is a cross-sectional side view of an illustrative top-emission organic light-emitting diode display pixel having a strong cavity and having a two-stripe design with red and green color filters and a blue subpixel with a blue color filter in accordance with an embodiment.

FIG. 19 is a cross-sectional side view of an illustrative four-subpixel tandem top-emission organic light-emitting diode display pixel with a weak cavity having a two-stripe design with a blue subpixel that does not have a blue color filter and having a yellow subpixel in accordance with an embodiment.

FIG. 20 is a cross-sectional side view of an illustrative four-subpixel tandem top-emission organic light-emitting diode display pixel with a weak cavity having a two-stripe design with a blue subpixel that has a blue color filter and having a yellow subpixel in accordance with an embodiment.

FIG. 21 is a cross-sectional side view of an illustrative four-subpixel tandem bottom-emission organic light-emitting diode display pixel having a two-stripe design with a blue subpixel that does not have a blue color filter and having a white subpixel in accordance with an embodiment.

FIG. 22 is a cross-sectional side view of an illustrative four-subpixel tandem bottom-emission organic light-emitting diode display pixel having a two-stripe design with a blue subpixel that has a blue color filter and having a white subpixel in accordance with an embodiment.

FIG. 23 is a cross-sectional side view of an illustrative four-subpixel tandem top-emission organic light-emitting diode display pixel with a weak cavity having a two-stripe design with a blue subpixel that does not have a blue color filter and having a white subpixel in accordance with an embodiment.

FIG. 24 is a cross-sectional side view of an illustrative four-subpixel tandem top-emission organic light-emitting diode display pixel with a weak cavity having a two-stripe design with a blue subpixel that has a blue color filter and having a white subpixel in accordance with an embodiment.

DETAILED DESCRIPTION

Figure 1:
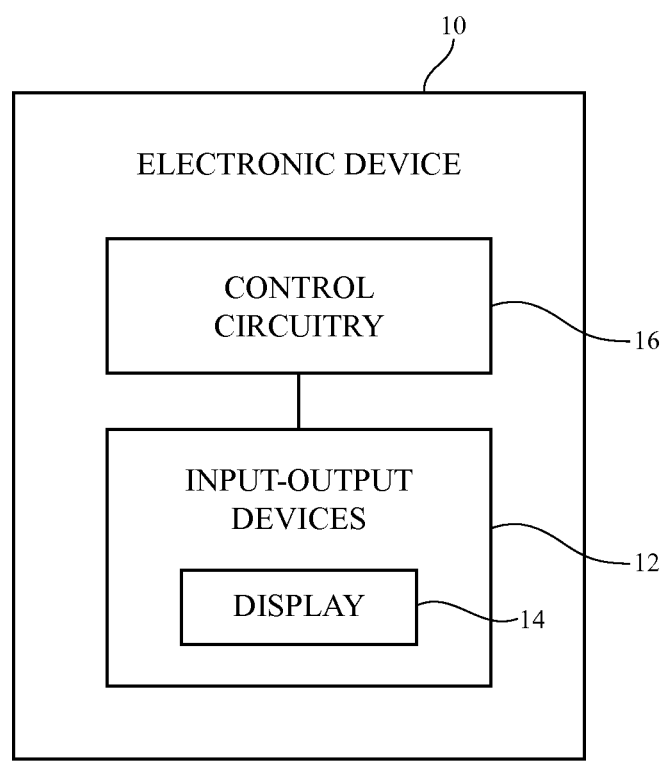
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Figure 2:
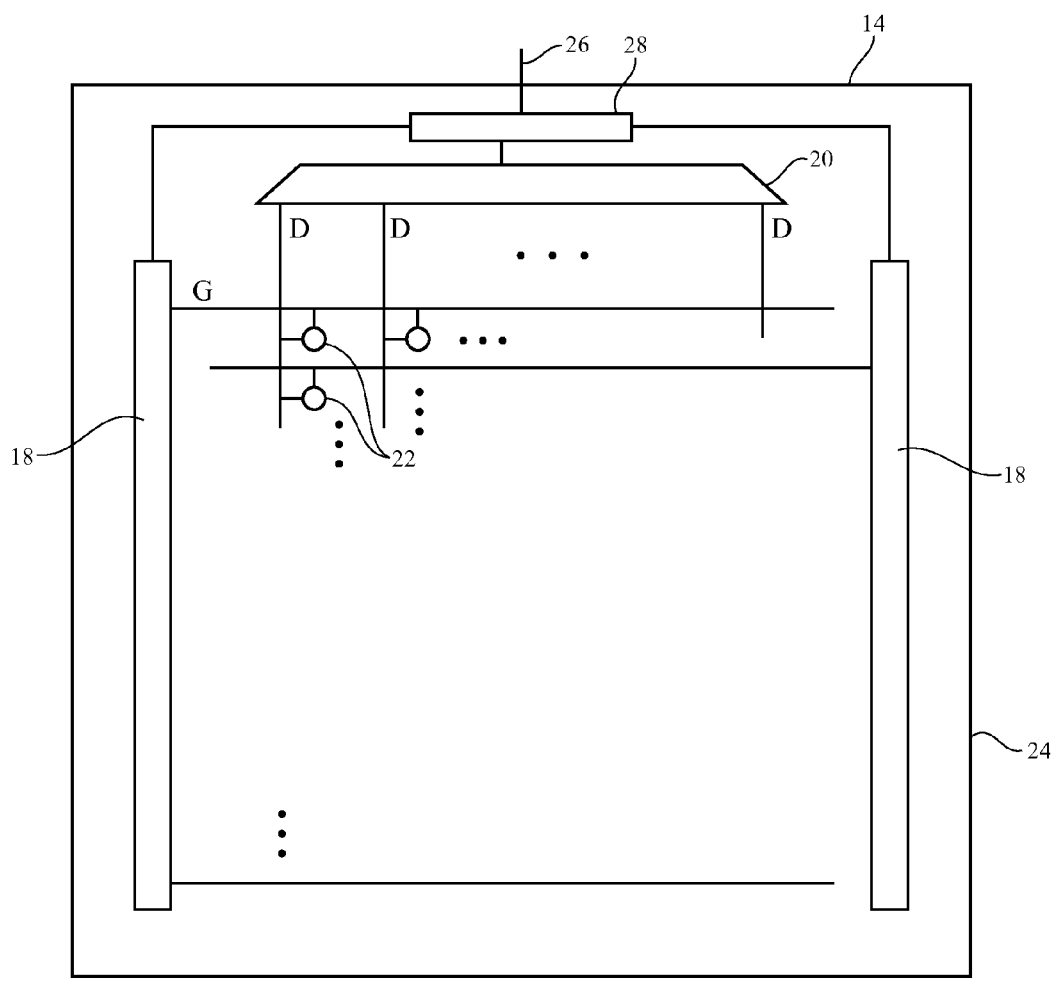
FIG. 2 is a diagram of an illustrative organic light-emitting diode display in accordance with an embodiment.

Display 14 may be an organic light-emitting diode display. As shown in the illustrative diagram of FIG. 2, display 14 may include layers such as substrate layer 24. Layers such as substrate 24 may be formed from planar rectangular layers of material such as planar glass layers, planar polymer layers, composite films that include polymer and inorganic materials, metallic foils, etc.

Display 14 may have an array of display pixels 22 for displaying images for a user. The array of display pixels 22 may be formed from rows and columns of display pixel structures (e.g., display pixels formed from structures on display layers such as substrate 24). There may be any suitable number of rows and columns in the array of display pixels 22 (e.g., ten or more, one hundred or more, or one thousand or more).

Display driver circuitry such as display driver integrated circuit(s) 28 may be coupled to conductive paths such as metal traces on substrate 24 using solder or conductive adhesive. Display driver integrated circuit 28 (sometimes referred to as a timing controller chip) may contain communications circuitry for communicating with system control circuitry over path 26. Path 26 may be formed from traces on a flexible printed circuit or other cable. The control circuitry may be located on a main logic board in an electronic device in which display 14 is being used. During operation, the control circuitry on the logic board (e.g., control circuitry 16 of FIG. 1) may supply control circuitry such as display driver integrated circuit 28 with information on images to be displayed on display 14.

To display the images on display pixels 22, display driver integrated circuit 28 may supply corresponding image data to data lines D while issuing clock signals and other control signals to supporting thin-film transistor display driver circuitry such as gate driver circuitry 18 and demultiplexing circuitry 20.

Gate driver circuitry 18 (sometimes referred to as scan line driver circuitry) may be formed on substrate 24 (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With this illustrative arrangement of FIG. 1, data lines D run vertically through display 14. Data lines D are associated with a respective columns of display pixels 22. There may be distinct data lines D for each of the subpixels in a display pixel 22. For example, in a display pixel that has separately controlled red, green, and blue subpixels, there may be three corresponding data lines for carrying respective red, green, and blue data.

Gate lines G (sometimes referred to as scan lines) run horizontally through display 14. Each gate line G is associated with a respective row of display pixels 22. If desired, there may be multiple horizontal control lines such as gate lines G associated with each row of display pixels. Gate driver circuitry 18 may be located on the left side of display 14, on the right side of display 14, or on both the right and left sides of display 14, as shown in FIG. 1.

Gate driver circuitry 18 may assert horizontal control signals (sometimes referred to as scan signals or gate signals) on the gate lines G in display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, data from data lines D is located into the corresponding row of display pixels. In this way, circuitry 28, 20, and 18 may provide display pixels 22 with signals that direct display pixels 22 to generate light for displaying a desired image on display 14. More complex control schemes may be used to control display pixels with multiple thin-film transistors (e.g., to implement threshold voltage compensation schemes) if desired.

Display driver circuitry such as demultiplexer circuitry 20 and gate line driver circuitry 18 may be formed from thin-film transistors on substrate 24. Thin-film transistors may also be used in forming circuitry in display pixels 22. The thin-film transistors in display 14 may, in general, be formed using any suitable type of thin-film transistor technology (e.g., silicon-based, semiconducting-oxide-based, etc.).

Figure 3:
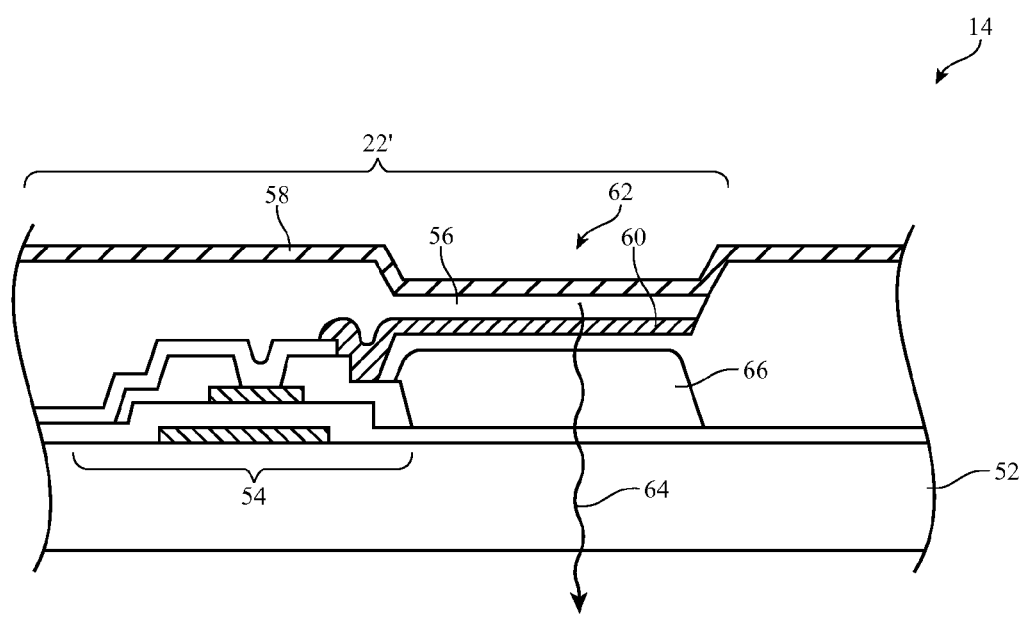
FIG. 3 is a cross-sectional side view of an illustrative organic light-emitting diode display in a bottom emission configuration in accordance with an embodiment.
Figure 4:
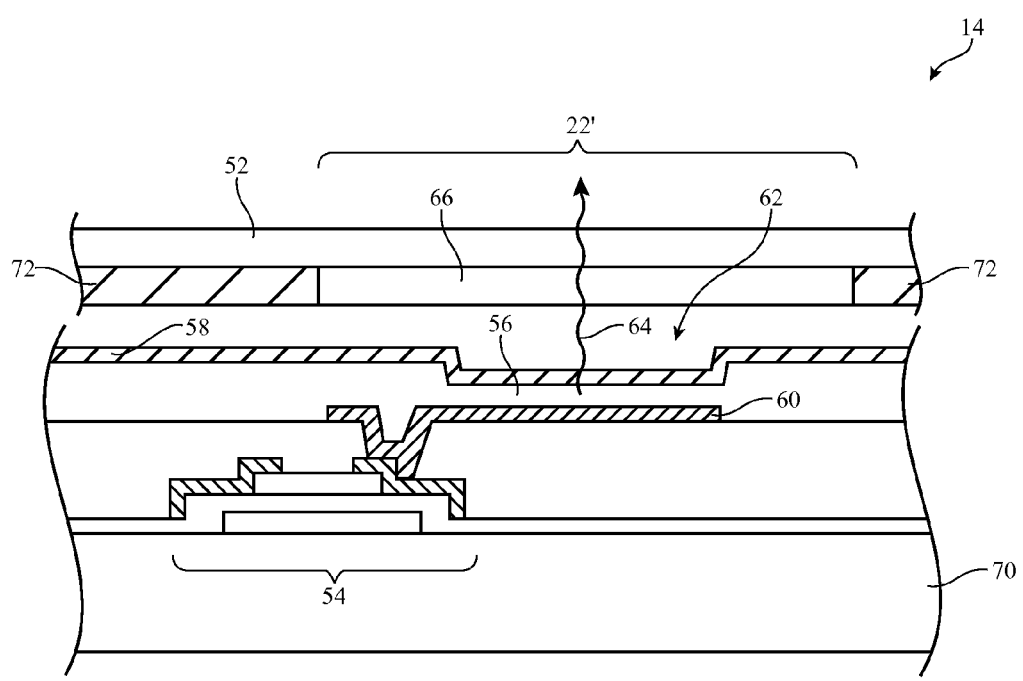
FIG. 4 is a cross-sectional side view of an illustrative organic light-emitting diode display in a top emission configuration in accordance with an embodiment.

Cross-sectional side views of configurations that may be used for display 14 of device 10 are shown in FIGS. 3 and 4. FIG. 3 is a cross-sectional side view of an illustrative bottom emission organic light-emitting diode display. FIG. 4 is a cross-sectional side view of an illustrative top emission organic light-emitting diode display.

In a bottom-emission display configuration of the type shown in FIG. 3, display 14 has a transparent substrate layer such as glass layer 52. Thin-film transistor circuitry such as thin-film transistor 54 may pass current between cathode 58 (e.g., a reflective metal layer formed from one or more metals such as aluminum and silver) and anode 60 (e.g., a transparent conductive layer such as a layer of indium tin oxide or indium zinc oxide) of light-emitting diode 62. As this current passes through organic light-emitting diode emissive electroluminescent layer 56 (sometimes referred to as a light emitting layer or emissive layer), light 64 is generated. The amount of current that is applied to electroluminescent material 56 controls the intensity of the resulting light 64 that is produced.

Light 64 passes through color filter element 66, which imparts a desired color to light 64. The resulting colored version of light 64 passes through clear substrate 52. The structures of FIG. 3 form a single subpixel 22' of a particular color (e.g., red in situations in which color filter element 66 is red, blue in situations in which color filter element 66 is blue, green in situations in which color filter element 66 is green, yellow or white or blue or other colors determined by the nature of emissive layer 56 in situations in which color filter element 66 is clear or is absent, etc.). There may be three or four subpixels 22' per display pixel 22 in display 14 or display pixels with other numbers of subpixels may be used. As an example, in a three-subpixel design display pixel 22 may have a first subpixel 22' that is red, a second subpixel 22' that is blue, and a third subpixel 22' that is green. In a four-subpixel design, display pixel 22 may have a first subpixel 22' that is red, a second subpixel 22' that is blue, a third subpixel 22' that is green and a fourth subpixel 22' that is yellow or white (as examples). If desired, subpixels can be shared between neighboring pixels. for example, subpixels of red, blue, or both red and blue may be shared between neighboring pixels so that the effective resolution of display 14 appears higher than the physical number of pixels.

In a top-emission display configuration of the type shown in FIG. 4, display 14 has a substrate layer such as substrate 70. Thin-film transistor structures such as thin-film transistor 54 may pass current between cathode 58 (e.g., a transparent conductive layer such as indium tin oxide or indium zinc oxide) and anode 60 (e.g., a light reflecting metal layer) of light-emitting diode 62. As this current passes through organic light-emitting diode emissive electroluminescent layer (emissive layer) 56, light 64 is generated. Light 64 passes through color filter element 66, which imparts a desired color to light 64, and passes through a transparent layer such as layer 52 (e.g., a transparent color filter substrate such as a layer of glass or plastic that is sometimes referred to as an encapsulation substrate). Black matrix 72 may prevent stray light from exiting display 14. Color filter elements 66 are formed on the underside of substrate 52 within openings in black matrix 72.

The structures of FIG. 4 form a single subpixel 22' of a particular color. As with bottom-emission displays, there may be three or four subpixels 22' per display pixel 22 or other suitable number of subpixels per display pixel 22 in display 14.

An illustrative display pixel using a bottom emission design is shown in FIG. 5. As shown in FIG. 5, display pixel 22 may have a common cathode, an electron injection layer (and electron transport layer) such as layer 80 that is common to all subpixels in pixel 22 and that is therefore sometimes referred to as a common electron injection layer, a segmented layer of emissive material including portion 56-1 and separate portion 56-2, a common hole injection layer (and hole transport layer) 82, a patterned anode layer 60 that forms separate respective anodes for blue subpixel 22-B, red subpixel 22'-R, and green subpixel 22'-G, color filter elements formed from a photoimageable polymer with colored dye or pigment (see, e.g., red color filter element 66R and green color filter element 66G), substrate 52 (including thin-film transistor circuitry for controlling pixel 22, sometimes referred to as backplane circuitry or a backplane), and circular polarizer 90 (to reduce ambient light reflections from metal structures in display 14 such as cathode 58). Blue subpixel 22'-B emits blue light 64B, red subpixel 22'-R emits red light 64R, and green subpixel 22'-G emits green light 64G. In bottom-emission designs such as the bottom-emission display pixel designs of FIGS. 5 and 6, common cathode 58 may be formed from a light-reflecting metal layer such as a layer of aluminum or silver. Anode 60 may be formed from a transparent conductive material such as indium tin oxide or indium zinc oxide.

The presence of color filter material in the light path of a subpixel tends to reduce light output efficiency, due to the absorption of the color filter material. Accordingly, display efficiency (i.e., the amount of output light generated for a given input power) may be maximized in some embodiments by omitting one or more color filters. In the configuration of FIG. 5, for example, blue subpixel 22' contains a blue emissive layer 56-1 that emits blue light 64B without using a blue color filter element on substrate 52. Blue light emission materials tend to be less efficient than red and green light emitting materials, so the size of blue subpixel 22'-B (and therefore the size of its emissive layer) may be larger than that of red subpixel 22'-R and may be larger than that of green subpixel 22'-G.

Emissive layers 56-1 and 56-2 of FIG. 5 serve to emit light under the control of current passing between cathode 58 and respective independently controllable separate anodes 60. The emissive layers of pixel 22 may be formed from an organic material (e.g., an emissive polymer layer or an emissive small molecule layer). If desired, different subpixels may be provided with different emissive materials by segmenting an emissive layer. As an example, a blue subpixel may be provided with an emissive material that emits blue light (sometimes referred to as a blue emissive layer), whereas other subpixels may be provided with an emissive material that emits light of different wavelengths. In configurations of the type shown in FIGS. 5 and 6, the emissive layer has a first portion 56-1 that is used by the blue subpixel and a separate second portion 56-2 that is used by non-blue subpixels (i.e., red and green subpixels in the example of FIGS. 5 and 6). By segmenting the emissive layer in this way, portions 56-1 and 56-2 need not emit light of the same color. Portion 56-1 may be a blue emissive layer, whereas portion 56-2 may be an emissive layer that emits red and green light (and not blue light). Portion 56-2 is used as a common emissive layer for both red subpixel 22'-R and green subpixel 22'-G (each having a respective color filter element). Portion 56-2 may be formed by stacked red and green layers or may be formed from a material that is formed from a mixture of red and green emitters rather than two separate stacked layers. If desired, the upper emissive layer (e.g., portion 56-2 may be formed from a yellow emissive layer rather than a red and green layer.

Shadow masks are used to pattern emissive layers such as emissive layers 56 of FIGS. 3 and 4. An emissive layer shadow mask has horizontal and vertical stripes of shadow mask material arranged in a grid to divide up the areas on a display into which emissive layers are being deposited. In the illustrative configuration of FIG. 5, the display pixels on display 14 such as display pixel 22 are being patterned using two shadow mask lines (stripes) per display pixel: shadow mask stripe 88-1 and shadow mask stripe 88-2. This shadow mask pattern repeats itself across the surface of display 14. The shadow mask is adjacent to display 14 during fabrication (e.g., during evaporation of emissive layer material) and is removed after emissive layer patterning is complete.

Using a two-stripe design of the type shown in FIG. 5, two shadow-mask stripes are used in creating two corresponding regions of subpixel structures. In particular, blue subpixels such as blue subpixel 22'-B form a first region (i.e., a first stripe) of subpixel structures in a column of display pixels 22 and red and green subpixel structures 22'-R and 22'-G form a second region (i.e., a second stripe) of subpixel structures. A first dead zone stripe (i.e., a first area in which no light is emitted because no emissive material is present) is formed under mask line 88-1. A second dead zone stripe is formed under mask line 88-2 (and so forth, for each display pixel in display 14). Configurations of the type shown in FIG. 5 are therefore sometimes referred to as using a two-stripe design.

In some conventional displays, a three-stripe design is used in which three separate shadow mask lines are used in patterning emissive material for three separate stripes of subpixels—blue, green, and red. In this type of design, there are three dead zones (areas in which no light is emitted) per display pixel. In a two-stripe display pixel array of the type shown in FIG. 5 a common emissive layer is shared between two adjacent subpixels so that there are only two stripes and therefore only two dead zones per display pixel. This reduces that area of the dead zone per display pixel and therefore allows display pixel aperture to be increased and/or the pixel pitch for display 14 to be increased.

As shown in FIG. 5, red subpixel 22'-R and green subpixel 22'-G share common emissive layer 56-2. Emissive layer 56-2 may emit red and green light (and not blue light). Red subpixel 22'-R may have a red color filter (color filter element) 66R, so output light 64R from subpixel 22'-R will be red. Green subpixel 22'-G may have a green color filter (color filter element) such as green color filter 66G, so that light 64G that is output from subpixel 22'-G will be green. Emissive material 56-1 may emit blue light (and not red or green light), so that output light 64B is blue. In the configuration of FIG. 5, blue subpixel 22'-B has no color filter on substrate 52, so blue output efficiency is enhanced. In the configuration of FIG. 6, blue subpixel 22'-B has a blue color filter (color filter element) 66B to enhance the purity of emitted blue light 64B.

FIGS. 7 and 8 are cross-sectional side views of an illustrative top-emission organic light-emitting diode configuration that may be used for forming display pixel 22. Display pixel 22'-B of FIG. 7 does not have a blue color filter so that efficiency is enhanced, whereas display pixel 22'-B of FIG. 8 has blue color filter 66B to enhance blue color purity in emitted blue light 64B.

In the top-emission configuration of FIG. 7, cathode 58 may be formed from a transparent conductive material such as indium tin oxide or indium zinc oxide. Anode 60 may be formed from a light-reflecting metal such as aluminum or silver. Because there are weak light reflections from transparent cathode 58, configurations of the type shown in FIG. 7 are sometimes said to form a weak optical cavities for the subpixels of pixel 22.

A strong optical cavity configuration for an illustrative top-emission display is shown in FIGS. 9 and 10. In the arrangement of FIG. 9, blue subpixel 22'-B is unfiltered (i.e., subpixel 22'-B does not have a blue color filter). In the arrangement of FIG. 10, blue color filter element 66B is present to enhance color purity for blue light 64B. Display pixels 22 of FIGS. 9 and 10 have a transreflective cathode. In particular, cathode 58 may be formed from a thin layer of metal or other material that exhibits comparable levels of transmission and reflection. As an example, cathode 58 may have a transmittance of 50% and a reflectance of 50%, may have a transmittance of 60% and a reflectance of 40% or may have other suitable amounts of transmission and reflection so that layer 58 is transreflective. Because display pixels 22 of FIGS. 9 and 10 have a transreflective cathode, light reflections within the diodes are strong. This type of configuration is therefore sometimes referred to as a strong cavity configuration.

Display pixel 22 may have transparent layers such as layers 92 and 94. Layers 92 and 94 may be formed from layers of clear material such as indium tin oxide or other transparent layers and may serve as cavity modification layers. The cavities (etalons) that are formed in the subpixels serve as optical filters with defined wavelength resonances and can therefore be used to enhance color purity. If desired, optical cavity modification layers such as layers 92 and 94 may be used to adjust the lengths of the cavities (and other optical properties of the cavities) and therefore their resonant wavelengths. The thickness of layer 92 may, for example, be adjusted to control the optical resonance of the cavity in red subpixel 22'-R. The thickness of layer 94, which is generally different than the thickness of layer 92, may be adjusted to control the resonant peak associated with the cavity of green subpixel 22'-G. By configuring the cavity resonances in the subpixels of pixel 22, the colors of light 64B, 64R, and 64G may be adjusted.

Figures 11, 12:
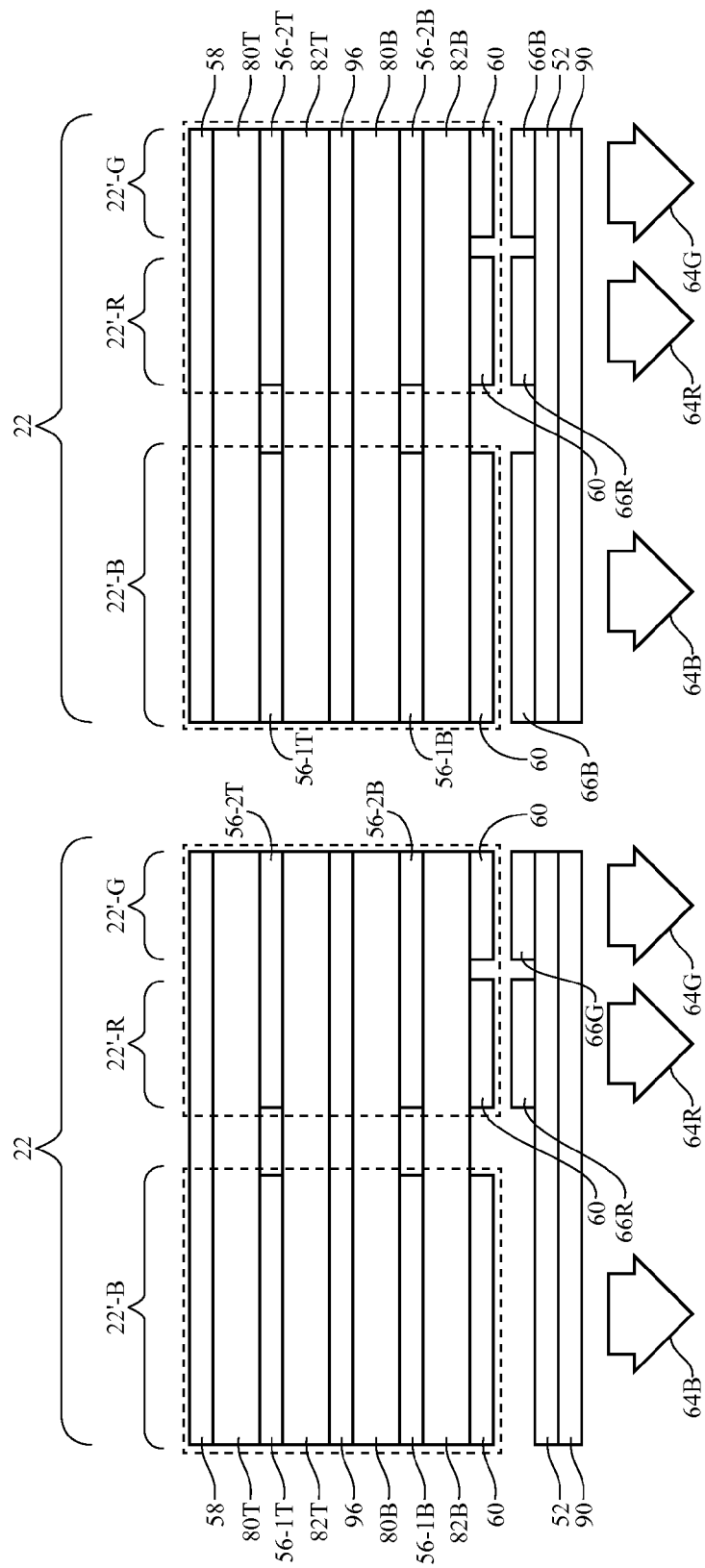
FIG. 11 is a cross-sectional side view of an illustrative tandem bottom-emission organic light-emitting diode display pixel having a two-stripe design with red and green color filters and with a blue subpixel without a blue color filter in accordance with an embodiment.
FIG. 12 is a cross-sectional side view of an illustrative tandem bottom-emission organic light-emitting diode display pixel having a two-stripe design with red and green color filters and with a blue subpixel with a blue color filter in accordance with an embodiment.

If desired, top-emission and bottom-emission pixel configurations may use a tandem design in which each subpixel has multiple emissive layers (and associated light-emitting diodes) operating in series. A tandem bottom-emission configuration is shown in FIGS. 11 and 12. Blue color filter layer 66B is absent in blue subpixel 22'-B of FIG. 11 and is present in blue subpixel 22'-B of FIG. 12.

Blue subpixel 22'-B of FIG. 11 has an upper diode formed from electronic injection layer (and electron transport layer) 80T, blue emissive layer 56-1T, and hole injection layer (and hole transport layer) 82T and has a lower diode formed from electronic injection layer (and electron transport layer) 80B, blue emissive layer 56-1B, and hole injection layer (and hole transport layer) 82B. Charge generation layer 96 may be interposed between the upper and lower diodes in each subpixel to ensure satisfactory diode operation. Charge generation layer 96 may be a conductive organic material or other material (e.g., a doped inorganic layer, etc.). The use of tandem blue diodes may enhance blue subpixel performance (e.g., diode lifetime may be increased since the current flowing through each diode is about half of what it would be in a non-tandem configuration).

Red subpixel 22'-R and green subpixel 22'-G may also each have a pair of series-connected organic light-emitting diodes. The upper diode in red subpixel 22'-R and the upper diode in green subpixel 22'-G share common emissive layer 56-2T. Layer 56-2T and layer 56-1T are formed at the same vertical location in pixel 22 but represent separate portions of the emissive layer at this vertical location. Because portions 56-1T and 56-2T are laterally separated from each other, they may be formed from different materials (i.e., materials that emit light at different wavelengths).

The lower diode in red subpixel 22'-R and the lower diode in subpixel 22'-G share common emissive layer 56-2B. Emissive layer 56-2B may be separate from layer 56-1B and may therefore emit light at different wavelengths than layer 56-1B. With one suitable arrangement, emissive layer 56-2T may be a green emissive layer producing green light 64G and emissive layer 56-2B may be a red emissive layer producing red light 64R (or vice versa). The use of tandem diodes for the red and green subpixels may help enhance color gamut and extend diode lifetime.

Figures 13, 14:
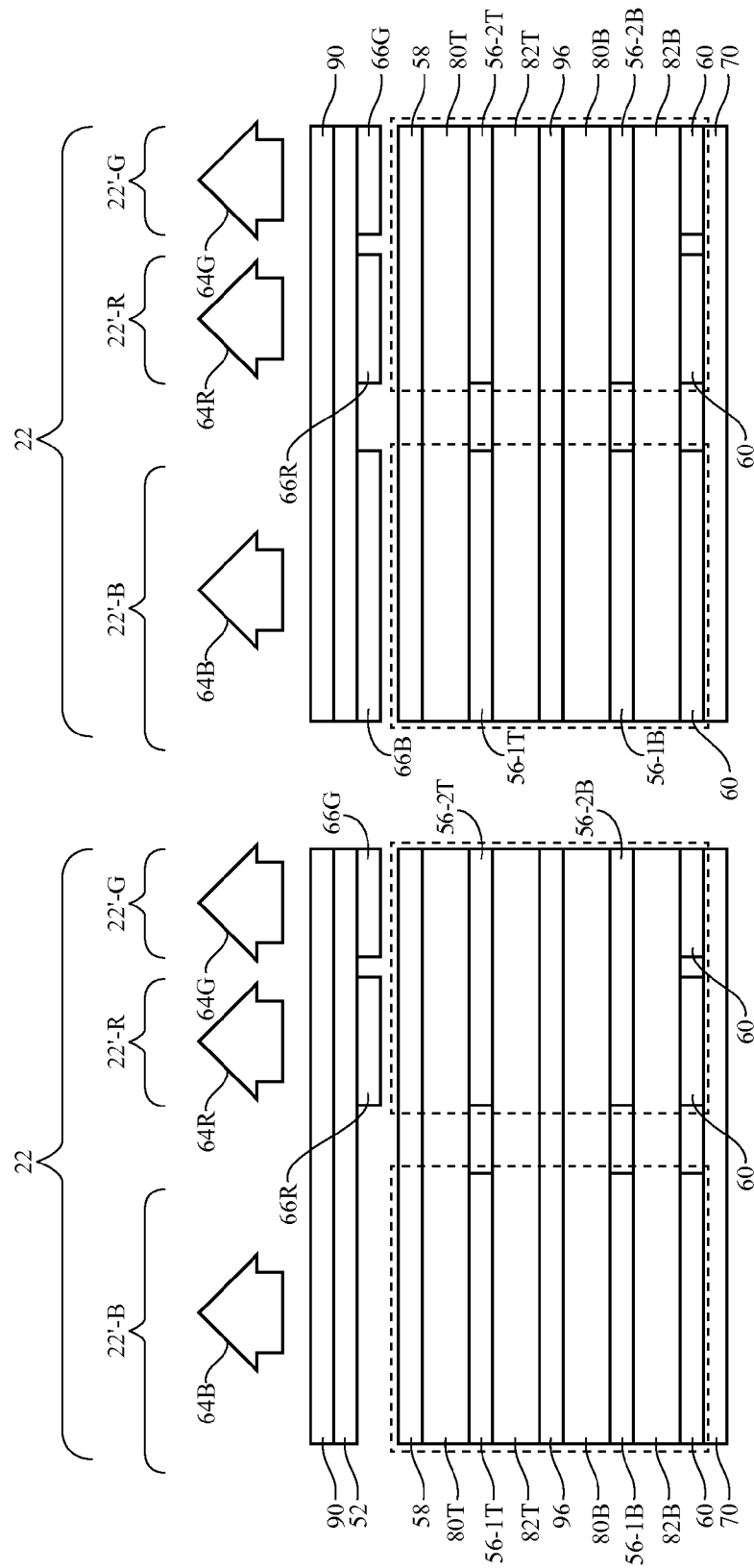
FIG. 13 is a cross-sectional side view of an illustrative tandem top-emission organic light-emitting diode display pixel having a weak cavity and having a two-stripe design with red and green color filters and with a blue subpixel without a blue color filter in accordance with an embodiment.
FIG. 14 is a cross-sectional side view of an illustrative tandem top-emission organic light-emitting diode display pixel having a weak cavity and having a two-stripe design having red and green color filters and with a blue subpixel with a blue color filter in accordance with an embodiment.

FIGS. 13 and 14 show top-emission weak cavity display pixels with tandem diodes. Subpixel 22'-B of display pixel 22 of FIG. 13 does not have a blue color filter element. Subpixel 22'-B of display pixel 22 of FIG. 14 has blue color filter element 66B to enhance blue color purity of blue light 64B.

Figures 15, 16:
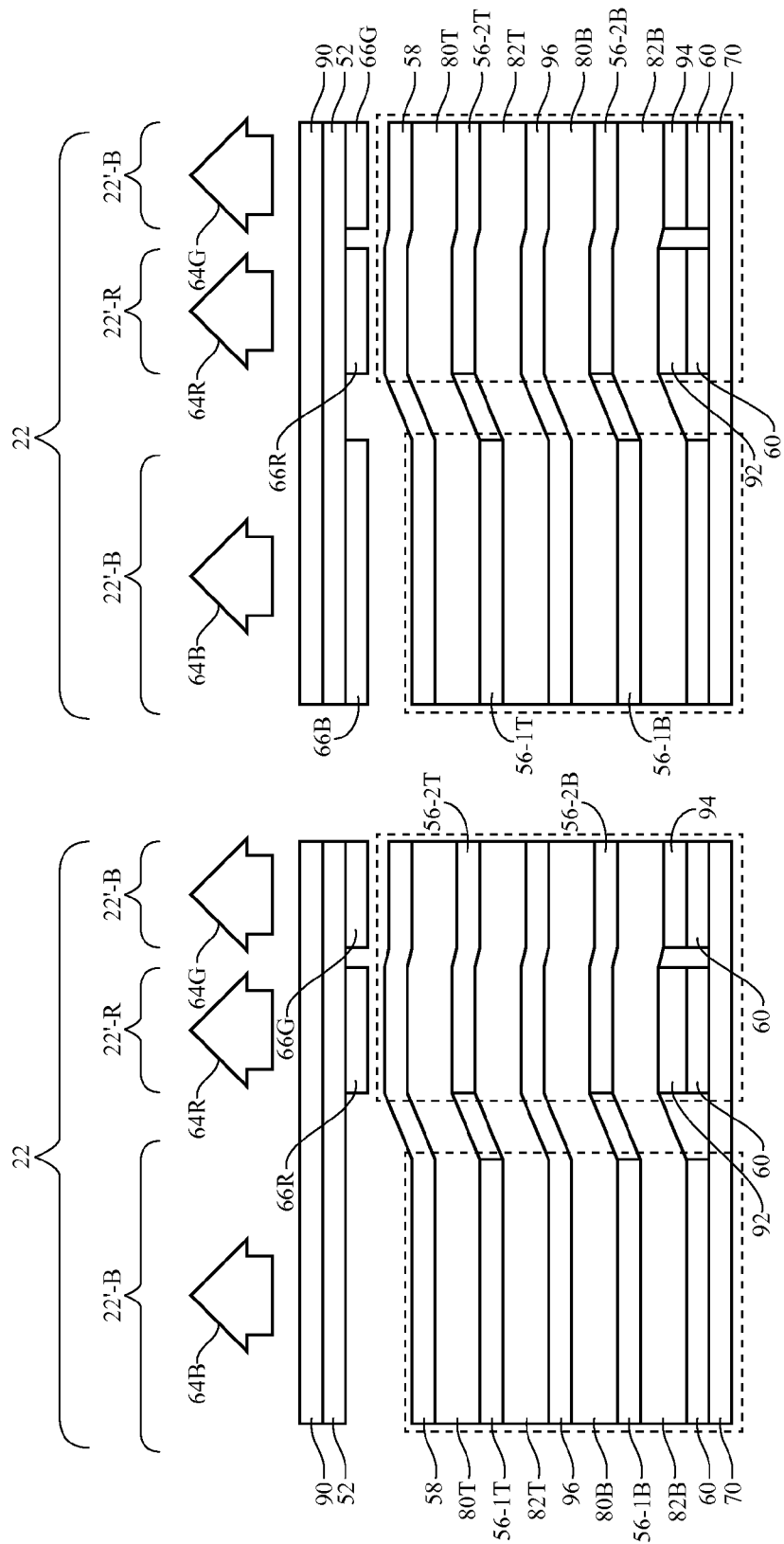
FIG. 15 is a cross-sectional side view of an illustrative tandem top-emission organic light-emitting diode display pixel having a strong cavity and having a two-stripe design with red and green color filters and with a blue subpixel without a blue color filter in accordance with an embodiment.
FIG. 16 is a cross-sectional side view of an illustrative top-emission organic light-emitting diode display pixel having a strong cavity and having a two-stripe design with red and green color filters and with a blue subpixel with a blue color filter in accordance with an embodiment.

FIGS. 15 and 16 show top-emission strong cavity display pixels with tandem diodes. Cavity modification layers such as layers 92 and 94 may be used in independently adjusting optical cavity properties for the blue, red, and green subpixels. Subpixel 22'-B of display pixel 22 of FIG. 15 does not have a blue color filter element. Subpixel 22'-B of display pixel 22 of FIG. 16 has blue color filter element 66B to enhance blue color purity of blue light 64B.

Figure 18:
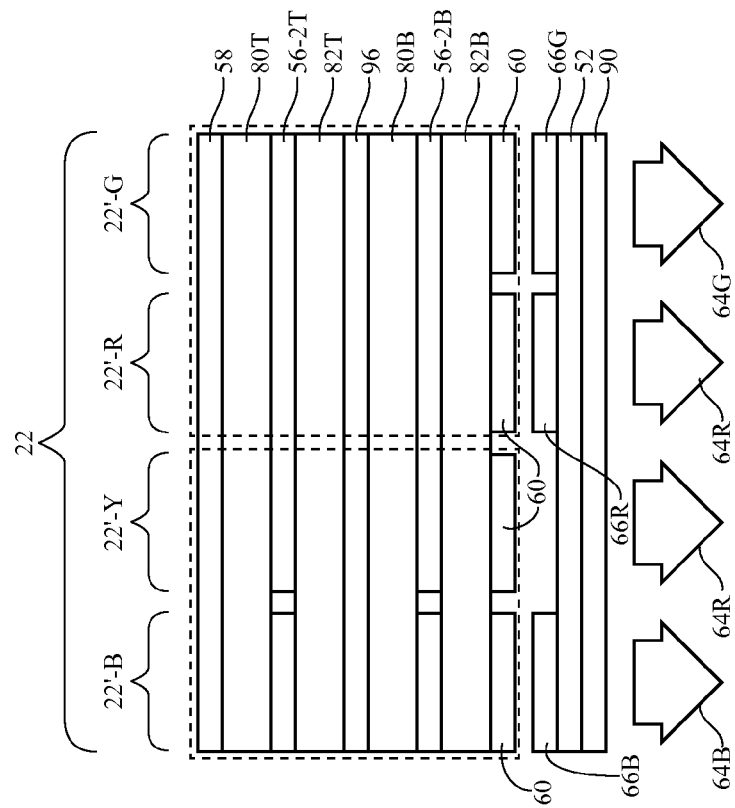
FIG. 18 is a cross-sectional side view of an illustrative four-subpixel tandem bottom-emission organic light-emitting diode display pixel having a two-stripe design with a blue subpixel that has a blue color filter and having a yellow subpixel in accordance with an embodiment.
Figure 17:
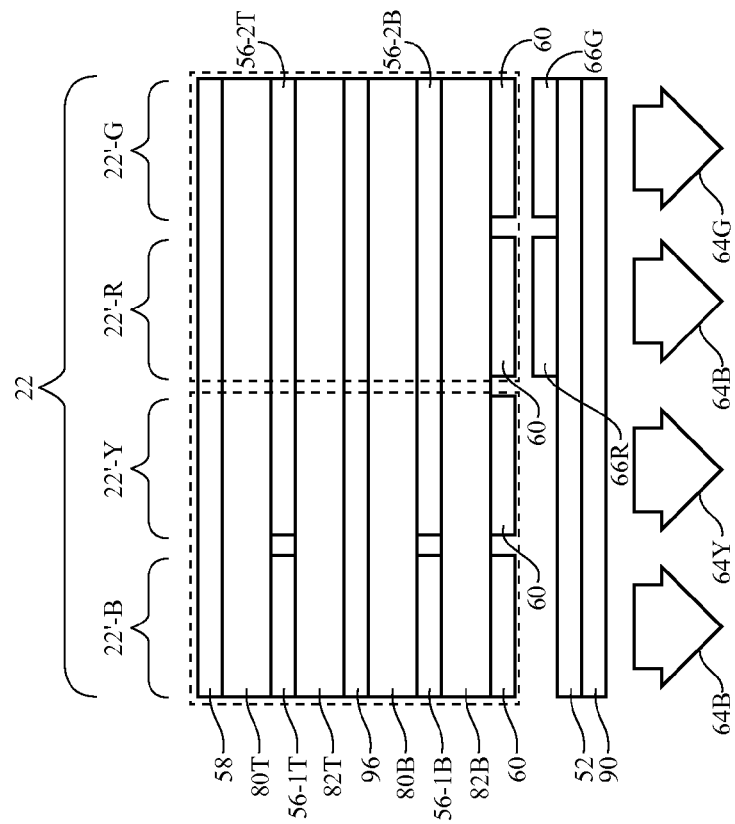
FIG. 17 is a cross-sectional side view of an illustrative four-subpixel tandem bottom-emission organic light-emitting diode display pixel having a two-stripe design with a blue subpixel that does not have a blue color filter and having a yellow subpixel in accordance with an embodiment.

FIGS. 17 and 18 show how display pixels 22 may be formed using a four subpixel design (e.g., a tandem four-pixel design). A two-strip design is used in which blue subpixels use a first pair of upper and lower emissive layers and in which the yellow, red, and green subpixels each share a common second pair of upper and lower emissive layers.

In the arrangements of FIGS. 17 and 18, emissive layers 56-1T and 56-1B may be blue emissive layers that produce blue light 64B for tandem blue diodes. Emissive layer 56-2T may be a green emissive layer and emissive layer 56-2B may be a red emissive layer (or vice versa). Red emissive layer 56-2T may produce red light 64R for red subpixel 22'-R. Green emissive layer 56-2B may produce green light 64G for green subpixel 22'-G. The combined green and red emissions of layers 56-2T and 56-2B may produce light that appears yellow to a viewer (i.e., yellow light 64Y in yellow subpixel 22'-Y may be produced partly by light from green emissive layer 56-2T and partly by light from red emissive layer 56-2B). In the configuration of FIG. 17, blue subpixel 22'-B has no blue color filter element so as to enhance efficiency and yellow subpixel 22'-Y has no color filter so as to enhance efficiency. If desired, blue and/or yellow subpixels may be provided with color filter elements. As shown in FIG. 18, for example, blue color filter 66B may be used to enhance the blue color purity of emitted blue light 64B.

FIGS. 19 and 20 show top-emission weak cavity display pixels with tandem diodes using a four-subpixel design in a two-stripe configuration. In the configuration of FIG. 19, blue subpixel 22'-B has no blue color filter element so as to enhance efficiency and yellow subpixel 22'-Y has no color filter so as to enhance efficiency. If desired, color filters may be added. For example, blue subpixel 22'-B may have a color filter such as blue color filter 66B to enhance the blue color purity of emitted blue light 64B, as shown in FIG. 20.

FIGS. 21 and 22 show bottom-emission weak cavity display pixels with tandem diodes using a four-subpixel design in a two-stripe configuration. In the configuration of FIG. 21, blue subpixel 22'-B has no blue color filter element to enhance efficiency and white subpixel 22'-W has no color filter to enhance efficiency. In the configuration of FIG. 22, blue subpixel 22'-B has blue color filter 66B to enhance the blue color purity of emitted blue light 64B.

The four-subpixel design of FIGS. 19 and 20 contained yellow subpixels 22'-Y. The four-subpixel design of FIGS. 21 and 22 has white subpixels 22'-W. The upper layer of emissive material is segmented. Portion (layer) 56-1T is a blue emissive layer that is used by the upper diode in blue subpixel 22'-B. Portion (layer) 56-2T is green-red emissive layer that produces green and red light. The red light is emitted as red light 64R by red subpixel 22'-R. The green light is emitted as green light 64G by green subpixel 22-G. Lower emissive layer 56B in pixel 22 of FIGS. 21 and 22 is a common (shared) blue emissive layer that is shared by all subpixels. In blue subpixel 22'-B, layers 56-1T and 56B produce blue light. In white subpixel 22'-W, blue light from emissive layer 56B combines with the red and green light from layer 56-2T to produce white light 64W. In the red and green subpixels, respective color filters 66R and 66G filter out all but the respective red and green light contributions from layer 56-2T.

FIGS. 23 and 24 show top-emission weak cavity display pixels with tandem diodes using a four-subpixel design in a two-stripe configuration. In the configuration of FIG. 23, blue subpixel 22'-B has no blue color filter element to enhance efficiency and white subpixel 22'-W has no color filter to enhance efficiency. In the configuration of FIG. 24, blue subpixel 22'-B has blue color filter 66B to enhance the blue color purity of emitted blue light 64B.

As with the pixels of FIGS. 21 and 22, the upper emissive region in the pixels of FIGS. 23 and 24 is formed from layers of two different materials. Layer 56-1T is a blue emission layer that is used by the upper diode in blue subpixel 22'-B. Layer 56-2T is green-red emissive layer that produces green and red light. The red light is emitted as red light 64R by red subpixel 22'-R. The green light is emitted as green light 64G by green subpixel 22-G. Lower emissive layer 56B in pixel 22 of FIGS. 23 and 24 is a blue emissive layer that is common to all four subpixels. In white subpixel 22'-W, blue light from emissive layer 56B combines with the red and green light from layer 56-2T to produce white light 64W. In the red and green subpixels, layer 56 produces red light and green light, respectively.

Figure 27:
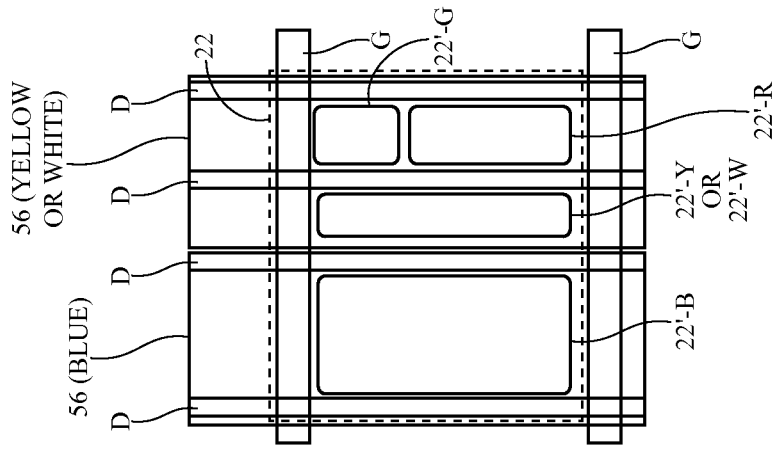
FIGS. 25, 26, and 27 are top views of illustrative display pixels showing subpixel layouts that may be used in accordance with an embodiment.
Figure 26:
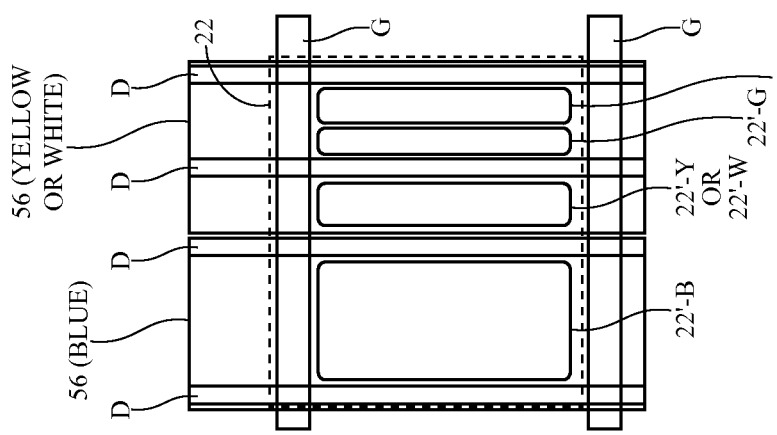
Figure 25:
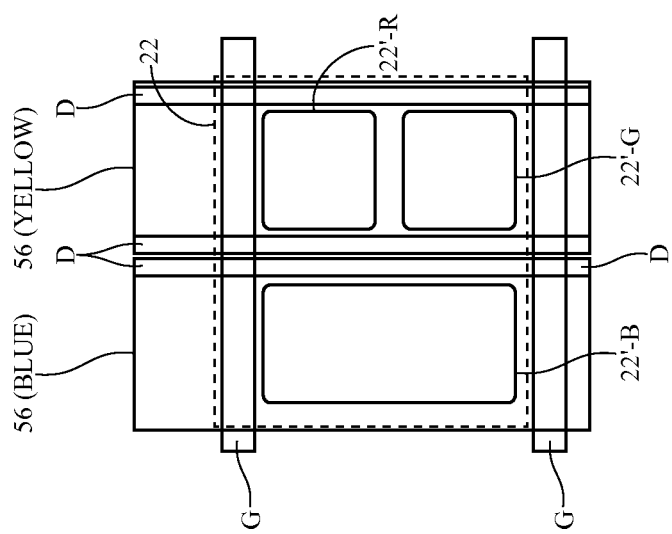

FIGS. 25, 26, and 27 are top views of illustrative layouts that may be used for display pixels 22. Illustrative emissive layer 56 may include a blue emissive layer 56 (blue), a yellow emissive layer 56 (yellow) or a white emissive layer 56 (white) (as examples). Data lines D run vertically through the pixels and gate lines (e.g., scan lines or other horizontal control lines) run horizontally through the pixels. Blue subpixels 22 '-B are generally larger than the other subpixels because blue emissive layers are relatively less efficient. The subpixel boundaries shown for illustrative subpixels 22'-B, 22'-R, 22'-G, and 22'-Y or 22'-W correspond to the outlines of openings in a dielectric pixel definition layer in which anodes 66 are formed. FIG. 25 is an illustrative layout that may be used for a three-subpixel design. FIGS. 26 and 27 are illustrative four-subpixel designs. Other layouts for pixels 22 may be used if desired. The configurations of FIGS. 25, 26, and 27 are merely illustrative.

Figure 28:
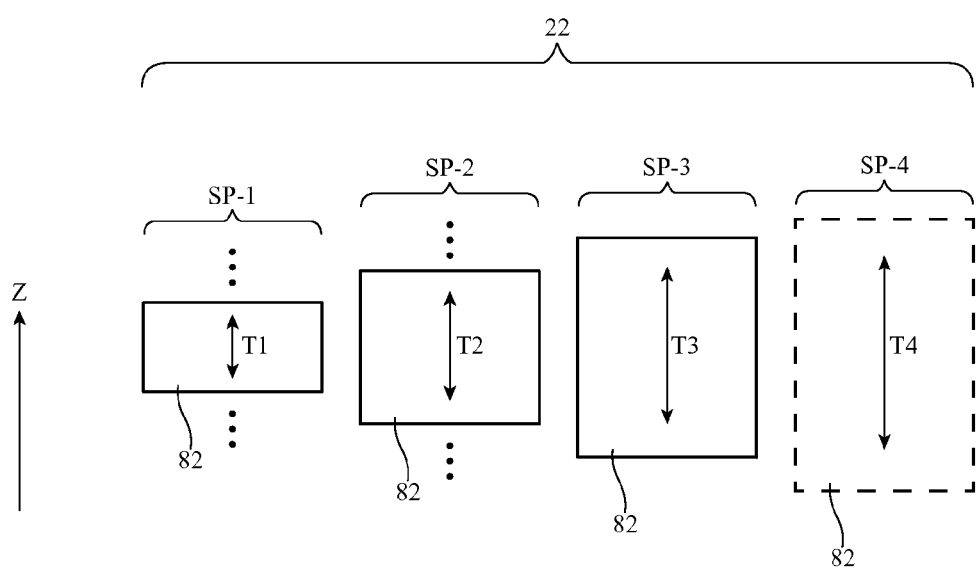
FIG. 28 is a cross-sectional side view of a display pixel showing how one or more subpixel hole injection layer thicknesses may be locally adjusted to control the resonant wavelength of optical cavities in subpixels of the display pixel in accordance with an embodiment.

If desired, the optical properties of the subpixel cavities in pixels 22 (i.e., strong cavity pixel designs) may be modified using one or more cavity modification layers formed from an organic material. For example, the thicknesses in vertical dimension Z of one or more of the layers of material in pixels 22 may be adjusted by performing material deposition using inkjet printing or by performing material deposition using thermal jet technology (i.e., inkjet printing in which the inkjet printing nozzle deposits a desired amount of material in a container on a resistive heater, which is then raised in temperature to heat the deposited material and to cause the heated material to be evaporated onto a desired target). Cavity modification layers such as layers 92 and 94 may, if desired, be omitted and the thickness of the subpixel cavities controlled by independently controlling the thicknesses of hole injection layer 82 (or layer 82T and/or layer 82B in tandem configurations) for each subpixel using inkjet printing and/or thermal jet deposition. Organic vapor phase jet technology may also be used in locally controlling the thicknesses of the hole injection layers or other layers of material in individual subpixels, if desired. FIG. 28 shows how three illustrative subpixels SP1, SP2, and SP3 in a three-subpixel design (and optionally an additional fourth subpixel SP4 in a four-subpixel design) may be provided with different respective hole injection layer thicknesses T1, T2, T3 and optionally T4 in vertical dimension Z (e.g., using inkjet printing, thermal jet deposition, or organic vapor phase jet deposition to deposit these layers).

Figure 29:
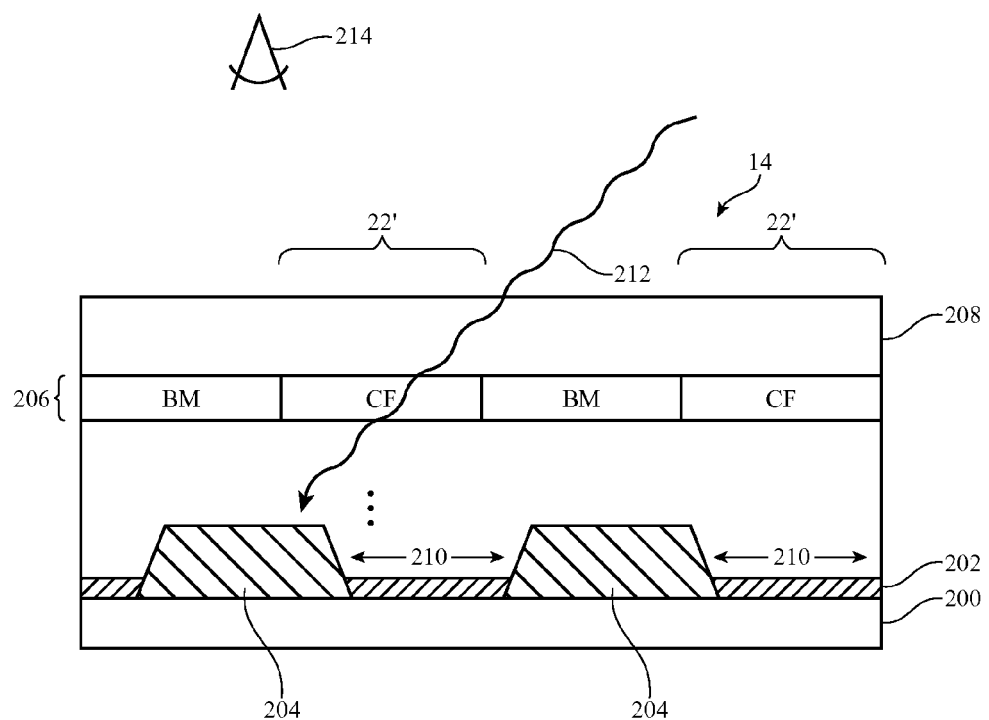
FIG. 29 is a cross-sectional side view of a display having a pixel definition layer formed from a light-absorbing material such as a black polymer in accordance with an embodiment.

Ambient light reflections are partially suppressed using circular polarizers in display 14 and by using color filter elements (which partly suppress white ambient light by only transmitting light that is colored the same as the color of the color filter element in each subpixel). Additional ambient light reflection suppression may be achieved by implementing a pixel definition layer in display 14 with a light absorbing material. Consider, as an example, display 14 of FIG. 29. Patterned pixel definition layer 204 may be formed on other display layers such as substrate and backplane layers 200 (e.g., thin-film transistor layer circuits). Openings 210 in pixel definition layer 204 are aligned with color filter element CF in respective subpixels 22' and contain diode layers 202 (e.g., anodes 60, organic layers, etc.). Color filter layer 206 may include color filter elements CF (e.g., red color filters, blue color filters, etc.) and black mask BM formed on substrate 208. Ambient light 212 may be transmitted through color filters CF, but, due to the light absorbing qualities of pixel definition layer 204, light 212 is absorbed by layer 204 and not reflected back out of display 14 towards viewer 214.

Figure 30:
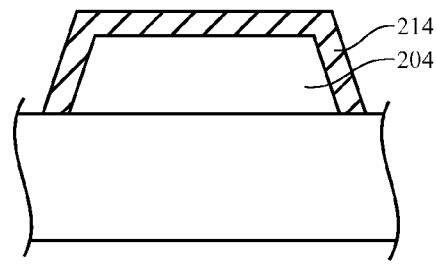
FIG. 30 is a cross-sectional side view of the pixel definition layer of FIG. 29 after coating with an optional moisture barrier coating in accordance with an embodiment.

Pixel definition layer 204 may, as an example, be implemented using black masking material (e.g., a photoimageable polymer containing a black filler such as carbon black or other light-absorbing filler material). Organic light-emitting diode structures can be sensitive to the presence of water vapor, so pixel definition layer 204 is preferably formed from a polymer that has low water vapor retention. Water vapor outgassing from pixel definition layer 204 may therefore be minimized. If desired, pixel definition layer 204 may be coated with a water vapor barrier layer such a moisture barrier layer 214 of FIG. 30. Layer 214 may be formed from one or more inorganic dielectric layers (e.g., one or more layers of silicon nitride, silicon oxide, etc.) or other suitable moisture vapor barrier material. When a black pixel definition layer is used in display 14, the circular polarizer in the display may be omitted or may be implemented using a weaker design that enhances light output efficiency from the light-emitting diodes.

The foregoing is merely illustrative and various modifications can be made by those skilled in the art without departing from the scope and spirit of the described embodiments. The foregoing embodiments may be implemented individually or in any combination.

What is claimed is:

1. A display pixel in an organic light-emitting diode display, comprising:
    a red subpixel with a red color filter;
    a green subpixel with a green color filter; and
    a blue subpixel, wherein the blue subpixel comprises a tandem subpixel having a pair of diodes connected in series, wherein the red subpixel comprises a tandem subpixel having a pair of diodes connected in series, wherein the green subpixel comprises a tandem subpixel having a pair of diodes connected in series, and wherein the blue subpixel is a blue subpixel without a blue color filter.

2. The display pixel defined in claim 1 further comprising an upper emissive layer and a lower emissive layer, wherein the upper emissive layer has a first portion in the blue subpixel and has a separate second portion common to the red and green subpixels.

3. The display pixel defined in claim 2 wherein the first portion of the upper emissive layer is a blue emissive layer.

4. The display pixel defined in claim 3 wherein the second portion of the upper emissive layer is a layer selected from the group consisting of: a green emissive layer, a red emissive layer, and a yellow emissive layer.

5. The display pixel defined in claim 3 wherein the lower emissive layer includes blue emissive material.

6. The display pixel defined in claim 1 wherein the blue subpixel has an upper blue emissive layer associated with a first blue light-emitting diode and has a lower blue emissive layer associated with a second blue light-emitting diode that is coupled in series with the first blue light-emitting diode.

7. The display pixel defined in claim 1 further comprising a blue emissive layer in the blue subpixel and a separate emissive layer shared by the red and green subpixels.

8. The display pixel defined in claim 7 further comprising a yellow subpixel that shares the separate emissive layer with the red and green subpixels.

9. The display pixel defined in claim 7 further comprising a white subpixel without a color filter, wherein the white subpixel shares the separate emissive layer with the red and green subpixels.

10. The display pixel defined in claim 7 wherein the separate emissive layer comprises a red-green emissive layer that emits red and green light.

11. The display pixel defined in claim 7 further comprising:
    an additional blue emissive layer, wherein the blue emissive layer and the additional blue emissive layer are parts of respective diodes connected in series in the blue subpixel.

12. The display pixel defined in claim 1 wherein the red subpixel and the green subpixel have hole injection layers of different thicknesses.

13. The display pixel defined in claim 12 further comprising a transreflective cathode common to the blue, red, and green subpixels.

14. A display pixel in an organic light-emitting diode display, comprising:
    a red subpixel with a red color filter;
    a green subpixel with a green color filter; and
    a blue subpixel having a first diode coupled in series with a second diode, wherein the first diode has a first blue emissive layer and wherein the second diode has a second blue emissive layer.

15. The display pixel defined in claim 14 wherein the red subpixel has a pair of diodes connected in series.

16. The display pixel defined in claim 15 wherein the green subpixel has a pair of diodes connected in series.

17. The display pixel defined in claim 16 wherein the red and green subpixels share at least one common emissive layer.

18. The display pixel defined in claim 17 wherein the display pixel has a pixel definition layer and wherein the pixel definition layer comprises a black polymer.

19. A display pixel in an organic light-emitting diode display, comprising:
    a red subpixel with a red color filter;
    a green subpixel with a green color filter;
    a blue subpixel;
    an organic emissive layer that emits light, wherein the organic emissive layer has a first portion in the blue subpixel and a second portion that is separate from the first portion and that is shared by the green and red subpixels; and
    a yellow subpixel that shares the second portion of the organic emissive layer with the red and green subpixels.

20. The display pixel defined in claim 19, wherein the blue subpixel is a blue subpixel without a blue color filter.

21. The display pixel defined in claim 20, wherein the yellow subpixel is a yellow subpixel without a color filter.

* * * * *